(12) United States Patent
Tatsumi

(10) Patent No.: US 7,917,778 B2
(45) Date of Patent: Mar. 29, 2011

(54) SEMICONDUCTOR INTEGRATED CIRCUIT AND METHOD FOR CONTROLLING SEMICONDUCTOR INTEGRATED CIRCUIT

(75) Inventor: Masahiro Tatsumi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 597 days.

(21) Appl. No.: 12/035,120

(22) Filed: Feb. 21, 2008

(65) Prior Publication Data

US 2008/0201584 A1    Aug. 21, 2008

(30) Foreign Application Priority Data

Feb. 21, 2007   (JP) ................................. 2007-041021

(51) Int. Cl.
  *G06F 1/26* (2006.01)
(52) U.S. Cl. .......................... 713/300; 713/323; 713/324
(58) Field of Classification Search .................. 713/300, 713/323, 324
See application file for complete search history.

(56) References Cited

U.S. PATENT DOCUMENTS

| 5,712,986 A | 1/1998 | Vo |
| 7,073,078 B2 * | 7/2006 | Srinivasan et al. ............. 713/300 |
| 2007/0234083 A1 * | 10/2007 | Lee ............................... 713/300 |

FOREIGN PATENT DOCUMENTS

JP    09-218849 A    8/1997

* cited by examiner

*Primary Examiner* — Nitin C Patel
(74) *Attorney, Agent, or Firm* — Arent Fox LLP

(57) ABSTRACT

Herein disclosed is a method for controlling a semiconductor integrated circuit having plural domains, the method including controlling plural power supplies which supply power to the plural domains, controlling an asynchronous bridge section being provided between each of the domains, receiving and transmitting data for dynamically changing a power supply voltage of at least one of the domains, wherein, when a power supply voltage of one of the domains is substantially equal to a power supply voltage of the other domains, switching the power supply paths so as to supply the power supply voltage from one power supply to at least two of the domains, and switching the data paths so as to receive and transmit data between the at least two of the domains by bypassing the asynchronous bridge section.

15 Claims, 15 Drawing Sheets

FIG.8

| Type | Power supply system | | Data pass connection | |
|---|---|---|---|---|
| State | Domain 4 | Domain 5 | Output of domain 4 | Output of domain 5 |
| ST1 | DC/DC Power supply 1 | DC/DC Power supply 2 | Connected to asynchronous bridge section 6 | Connected to asynchronous bridge section 6 |
| ST2 | DC/DC Power supply 2 | DC/DC Power supply 1 | Connected to asynchronous bridge section 6 | Connected to asynchronous bridge section 6 |
| ST3 | DC/DC Power supply 1 | DC/DC Power supply 1 | Bypassed | Bypassed |
| ST4 | DC/DC Power supply 2 | DC/DC Power supply 2 | Bypassed | Bypassed |

FIG.14

| Type | State | Power supply system | | | | Data system | | |
|---|---|---|---|---|---|---|---|---|
| | | Domain 34-1 | Domain 34-2 | Domain 34-3 | Domain between 34-1,34-2 | Domain between 34-2,34-3 | Domain between 34-3,34-4 |
| Different voltage between all domains | ST1 | Power supply 31-1 | Power supply 31-2 | Power supply 31-3 | Asynchronous bridge section | Asynchronous bridge section | Asynchronous bridge section |
| | ST2 | Power supply 31-3 | Power supply 31-2 | Power supply 31-1 | Asynchronous bridge section | Asynchronous bridge section | Asynchronous bridge section |
| Same voltage between partial domains | ST3 | Power supply 31-1 | Power supply 31-1 | Power supply 31-3 | Bypass | Asynchronous bridge section | Asynchronous bridge section |
| | ST4 | Power supply 31-1 | Power supply 31-2 | Power supply 31-1 | Asynchronous bridge section | Asynchronous bridge section | Bypass |
| | ST5 | Power supply 31-1 | Power supply 31-3 | Power supply 31-1 | Asynchronous bridge section | Asynchronous bridge section | Bypass |
| | ST6 | Power supply 31-1 | Power supply 31-3 | Power supply 31-3 | Asynchronous bridge section | Bypass | Asynchronous bridge section |
| | ST7 | Power supply 31-4 | Power supply 31-3 | Power supply 31-3 | Asynchronous bridge section | Bypass | Asynchronous bridge section |
| | ST8 | Power supply 31-4 | Power supply 31-1 | Power supply 31-1 | Asynchronous bridge section | Asynchronous bridge section | Bypass |
| | ST9 | Power supply 31-3 | Power supply 31-2 | Power supply 31-1 | Asynchronous bridge section | Asynchronous bridge section | Bypass |
| | ST10 | Power supply 31-3 | Power supply 31-3 | Power supply 31-1 | Bypass | Asynchronous bridge section | Asynchronous bridge section |
| Same voltage between all domains | ST11 | Power supply 31-1 | Power supply 31-1 | Power supply 31-1 | Bypass | Bypass | Bypass |
| | ST12 | Power supply 31-3 | Power supply 31-3 | Power supply 31-3 | Bypass | Bypass | Bypass |

US 7,917,778 B2

SEMICONDUCTOR INTEGRATED CIRCUIT AND METHOD FOR CONTROLLING SEMICONDUCTOR INTEGRATED CIRCUIT

CROSS-REFERENCE TO RELATED APPLICATIONS

This application is based upon and claims the benefit of priority from Japanese Patent Application No. 2007-41021 filed on Feb. 21, 2007, the entire contents of which are incorporated herein by reference.

BACKGROUND OF THE INVENTION

The present invention relates to a semiconductor integrated circuit and a method for controlling the semiconductor integrated circuit.

FIG. 1 shows an exemplary block diagram of a semiconductor integrated circuit that uses power supply voltages from plural power supplies. The semiconductor integrated circuit 101 includes domains 102, 103, an asynchronous bridge section 104, and a power supply control section 105. The domain 102 is a circuit section that uses the power supply voltage from a DC/DC power supply 111. The domain 103 is a circuit section that uses the power supply from the DC/DC power supply 112. The power supply section 105 controls the power supply voltage that the DC/DC power supplies 111, 112 output. If the domains 102 and 103 use different power supply voltages and a signal is transmitted and received between the domains 102 and 103, the voltage level of the signal is converted and transmitted by the asynchronous bridge section 104. The asynchronous bridge section 104 may change the timing of the signal.

FIG. 2 shows an exemplary block diagram of a semiconductor integrated circuit that is not provided with the asynchronous bridge section 104. In FIG. 2, like numerals depict like elements as those shown in FIG. 1. As shown in FIG. 2, the domains 102 and 103 are directly connected in the semiconductor integrated circuit 101A.

Japanese Patent Application Laid-Open No. H 9-218849 discloses a method and a device to bridge devices that operate at different clock frequencies.

For example, the power supplies 111, 112 shown in FIG. 1 are DC/DC power supplies, and the output voltage of each of the power supplies 111, 112 is a 1.2V power supply voltage. For example, when the operation clock of the circuits in the domains is drastically changed, a rapid current fluctuation occurs, as shown in FIG. 3. As a result, when the power supply voltage is affected by the rapid change of load current, a phenomenon can occur that is characterized by a change in the power supply voltage, such as a change between 1.1V and 1.3V, for example. FIG. 3 is a timing chart that shows the effect of load change on the power supply voltage. As shown in FIG. 3, Vout is the output power supply voltage of the DC/DC power supply, and IL is the current in the DC/DC power supply, wherein the current IL changes, for example, from 100 mA to 600 mA, as affected by the load change.

If such a phenomenon occurs in the DC/DC power supply that includes the power supplies 111, 112, an excessive potential difference of 0.2V or more can result between the domains 102 and 103. As a result, for example, if the semiconductor integrated circuit 101 is required to process a heavy load through domains 102 and 103, which operate at the same high power supply voltage, and the signal is transmitted and received between the domains 102 and 103 through the asynchronous bridge section 104 for the aforementioned reason, high-speed data may not be transferred.

SUMMARY

According to an aspect of an embodiment of the present invention, a semiconductor integrated circuit includes an asynchronous bridge section provided between plural domains that use power supply voltage from plural power supplies, and a configuration that at least can dynamically change the power supply used in each domain depending on the load. When plural domains use the same power supply, plural power supply control is performed to supply power from one power supply, and when the power supply voltage to use is increased to perform high-speed data transfer, the asynchronous bridge section is bypassed.

BRIEF DESCRIPTION OF THE DRAWINGS

FIG. 8 shows an exemplary operating state of each section in the semiconductor integration circuit when the power supply is switched.

FIG. 14 shows an exemplary operating state of each section in the semiconductor integrated circuit when the power supply is switched.

DESCRIPTION OF THE PREFERRED EMBODIMENTS

In the following descriptions, many of the exemplary circuits are shown to include n-channel metal-oxide-semiconductor field-effect transistors (MOSFETs) in a variety of configurations. While MOSFET devices are used by example, the disclosed circuits may be implemented using any number of other transistor types, such as J-FETs, bipolar transistors, and so on. Additionally, while n-channel devices are used in the following examples, the same general approaches may also apply to circuits incorporating p-channel FETs or PNP bipolar transistors, for example.

Figure 1:
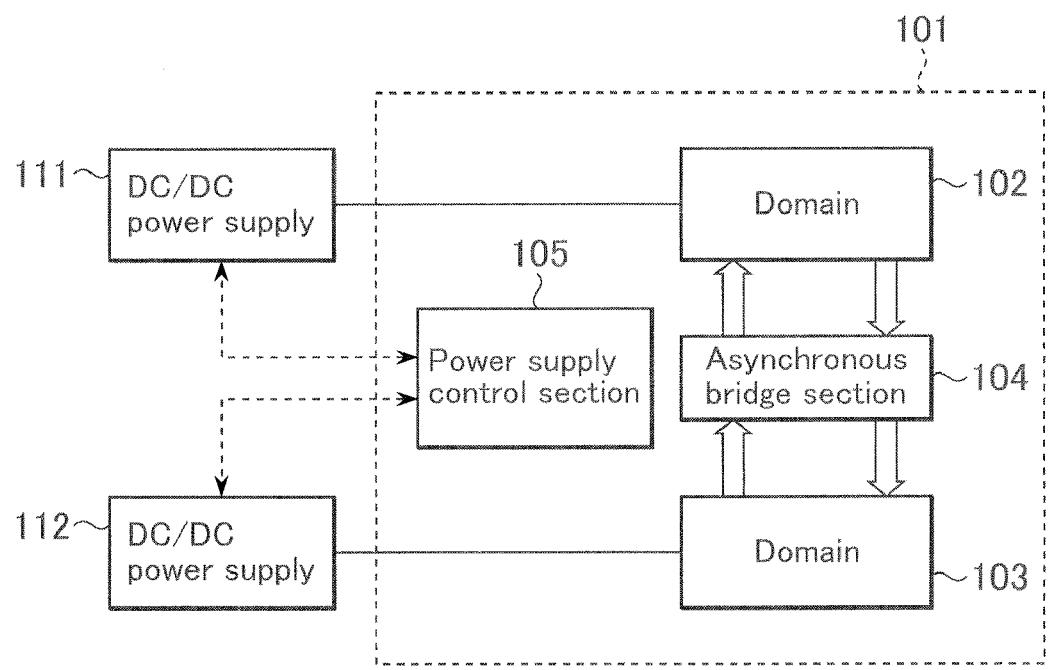
FIG. 1 shows a block diagram of an exemplary semiconductor integrated circuit that uses power supply voltage from plural power supplies.
Figure 2:
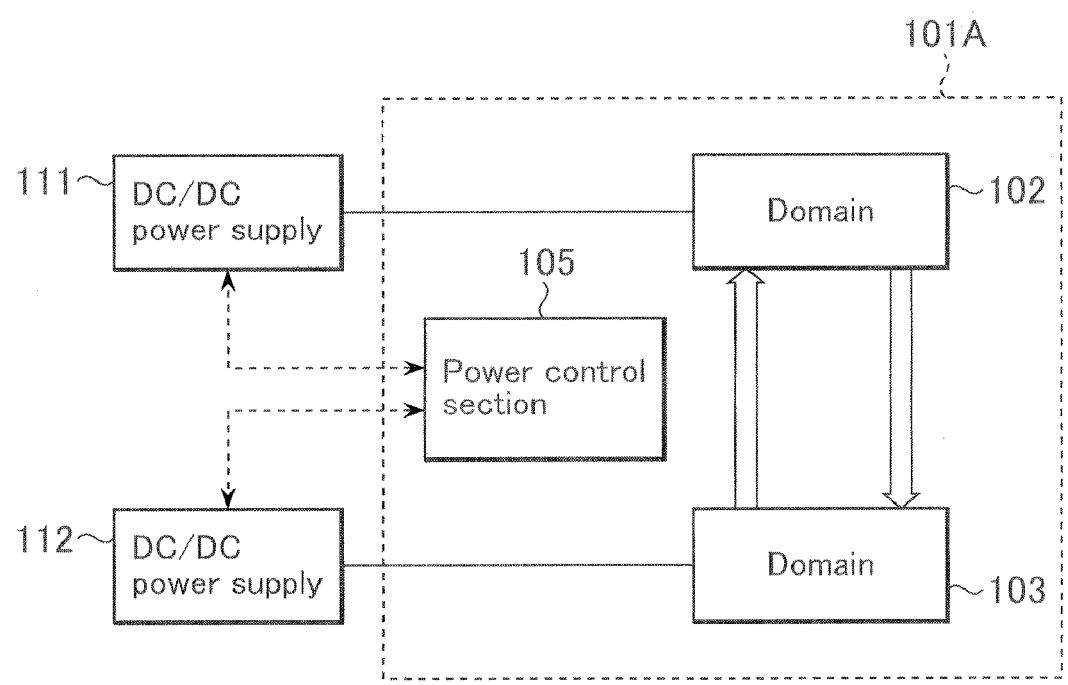
FIG. 2 shows a block diagram of an exemplary semiconductor integrated circuit that is not provided with the asynchronous bridge section.
Figure 3:
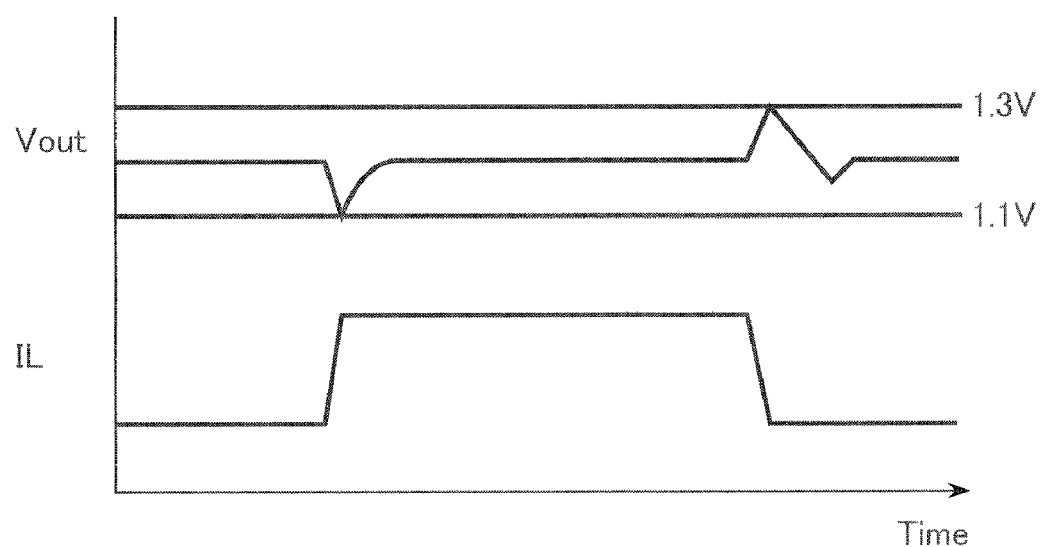
FIG. 3 shows an exemplary operation schematic diagram of the DC/DC power supply.
Figure 4:
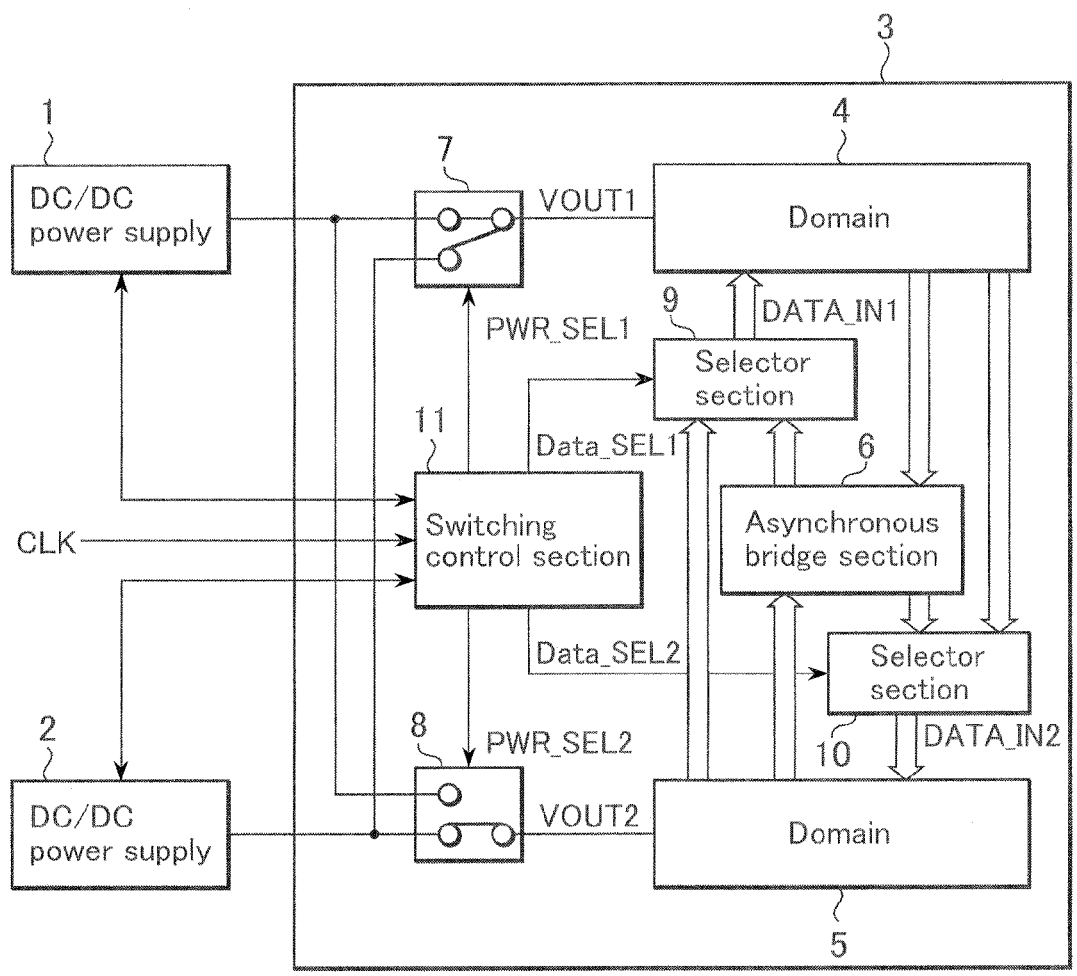
FIG. 4 shows a block diagram of an exemplary semiconductor integrated circuit of a first embodiment.

FIG. 4 shows an exemplary block diagram of a semiconductor integrated circuit of one embodiment. As shown in FIG. 4, output power supply voltage of DC/DC power supplies 1, 2 can be controlled, and the DC/DC power supplies 1, 2 can supply the power supply voltages to a semiconductor integrated circuit 3, which can be a Large Scale Integration (LSI) circuit, for example. The semiconductor integrated circuit 3 includes domains 4, 5, an asynchronous bridge 6, power supply switching sections 7, 8, selector sections 9, 10, and a switching control section 11. The domain 4 is a circuit section and the power of the domain 4 is supplied by the DC/DC power supply 1 or DC/DC power supply 2. The domain 5 is a circuit section and the power of the domain 5 is supplied by the DC/DC power supply 2 or the DC/DC power supply 1. The switching section 11 controls an output voltage of the DC/DC power supplies 1, 2, as well as the power supply switching sections 7, 8 and selector sections 9, 10. The power supply switching sections 7, 8 are controlled by the control signals PWR_SEL1, PWR_SEL2 from the switching control section 11 so as to control one of power supply voltages output by the DC/DC power supplies 1, 2 as the power supply voltages VOUT1, VOUT2. The selector sections 9, 10 are connected between the domains 4, 5 and controlled by control signals Data_SEL1, Data_SEL2 from the switching control section 11. The selector sections 9, 10 select the signal from the asynchronous bridge section 6 or bypass the asynchronous bridge section 6. Data DATA_IN1 is input to the domain 4 from the selector section 9. Data DATA_IN2 is input to the domain 5 from the selector section 10. If the power voltage of the domain 4 is different from the power voltage of the domain 5, and if a signal is transmitted and received between the domains 4 and 5, the signal is transmitted and received via the asynchronous bridge section 6 and the signal level is converted and synchronized.

The DC/DC power supplies 1 and 2 may have the same configuration; the power supply switching sections 7 and 8 may have the same configuration; and the selectors 9 and 10 may have the same configuration.

In addition, when the domain 4 always uses only the power supply voltage from the DC/DC power supply 1 and the domain 5 always uses only the power supply voltage from the DC/DC power supply 2, the power supply switching sections 7, 8 can be omitted. Further, the switching control section 11 can be provided outside of the semiconductor integrated circuit 3.

Figure 5:
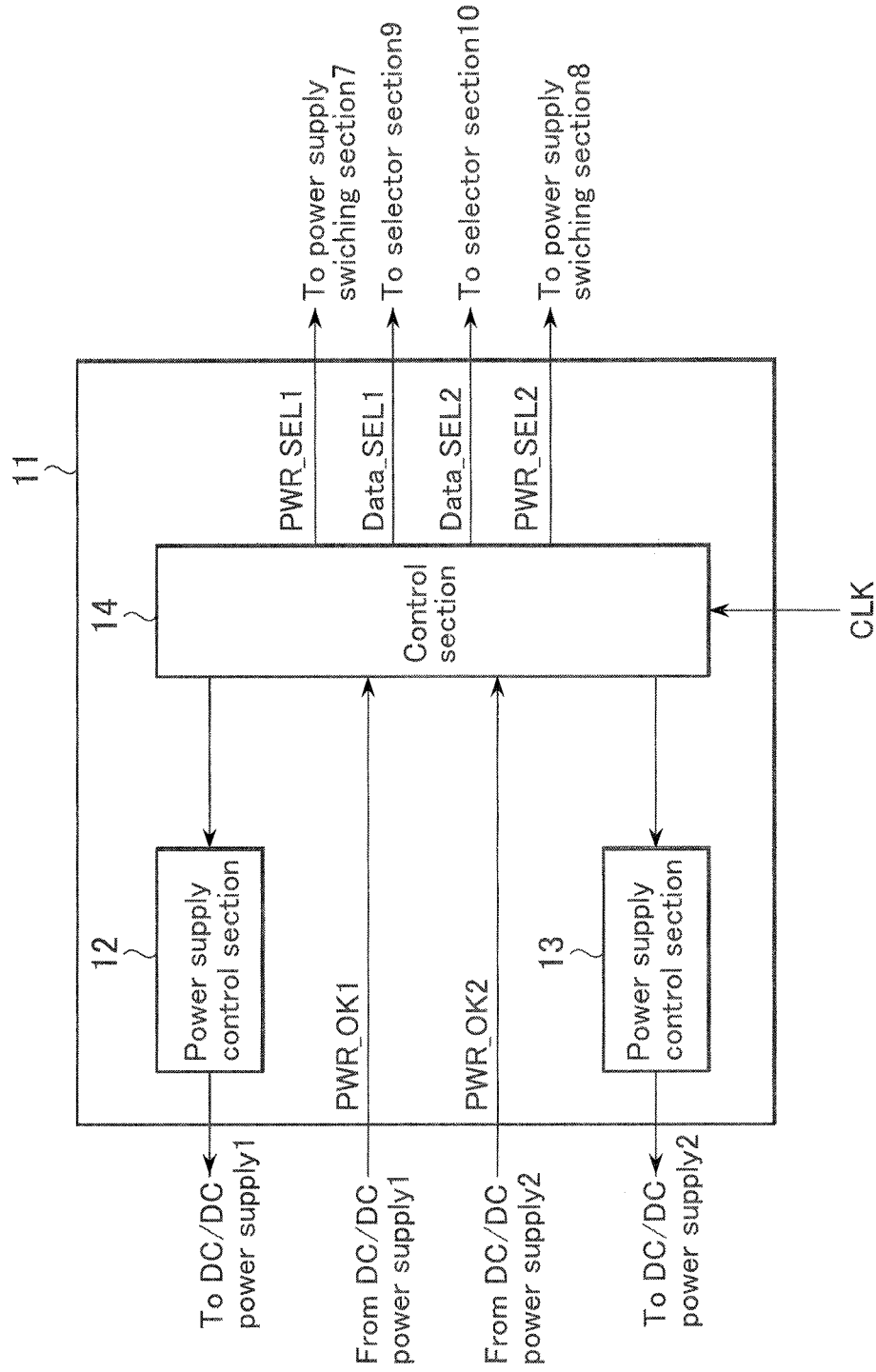
FIG. 5 shows a block diagram of an exemplary configuration of the switching control section.

FIG. 5 shows an exemplary block diagram of the configuration of the switching control section 11. The switching control section 11 includes the power supply control sections 12, 13 and the control section 14. The power supply control sections 12, 13 may have the same configuration. The power supply control sections 12, 13 control the power supply voltage output from the DC/DC power supplies 1, 2 to the target voltage according to the direction from the control section 14. The DC/DC power supplies 1, 2 output voltage adjustment completion notifications PWR_OK1, PWR_OK2 to show that voltage adjustment is complete when the power supply voltage to output is adjusted to the target voltage directed from the control section 14. The control section 14 outputs the control signals PWR_SEL1, PWR_SEL2, Data_SEL1, Data_SEL2 after waiting for the voltage adjustment completion notifications PWR_OK1, PWR_OK2 from the DC/DC power supplies 1, 2 and controls the power supply switching sections 7, 8 and the selector sections 9, 10.

Figure 6:
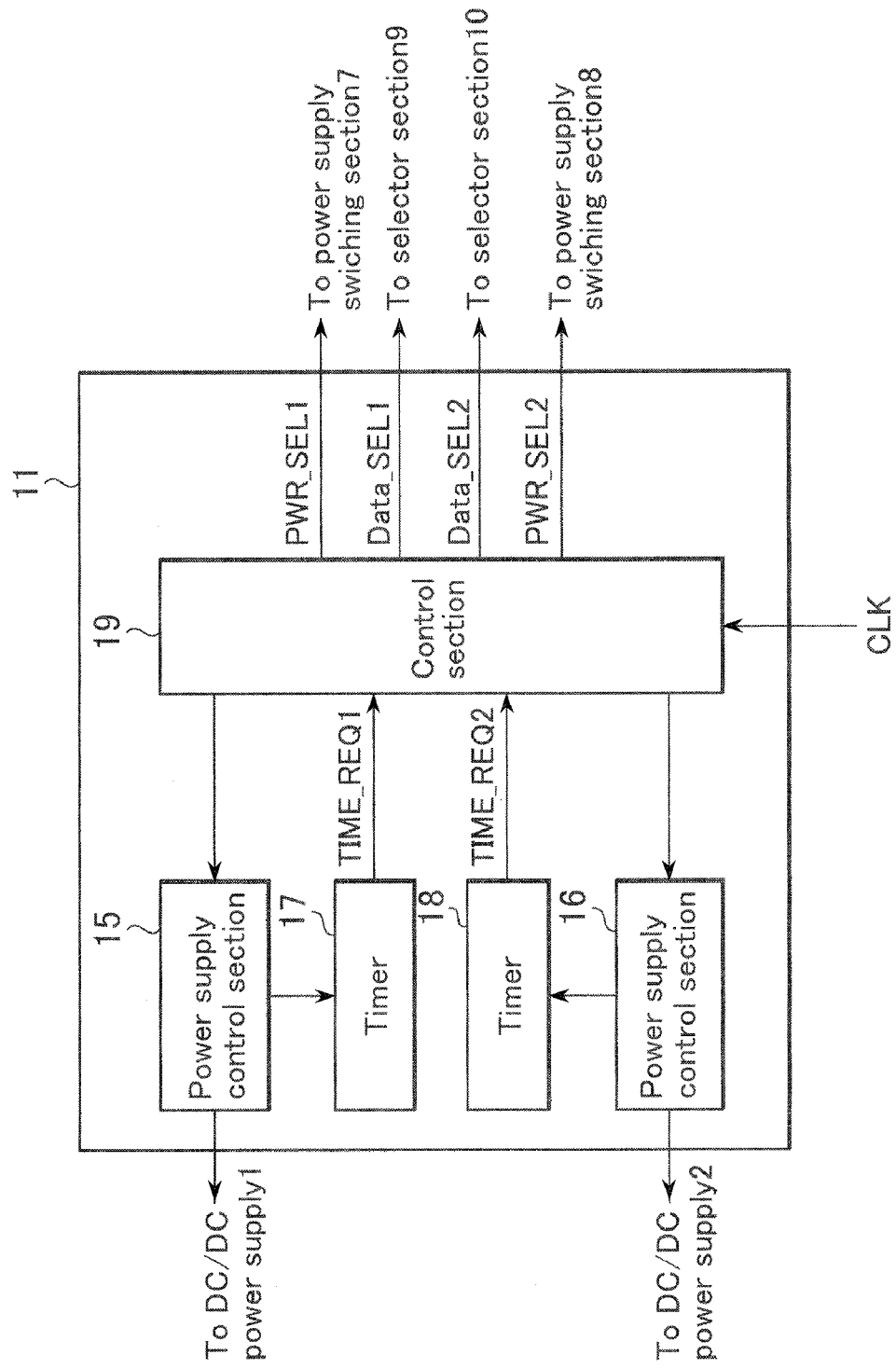
FIG. 6 shows a block diagram of another exemplary configuration of the switching control section.

FIG. 6 shows a block diagram of another exemplary configuration of the switching control section 11. The switching control section 11 includes the power supply control sections 15, 16, timers 17, 18, and the control section 19. The power supply control sections 15 and 16 may have the same configuration and the timers 17 and 18 may have the same configuration. The power supply control sections 15, 16 control the power supply voltage output from the DC/DC power supplies 1, 2 to the target voltage according to the direction from the control section 19. Further, the power supply control sections 15, 16 direct the timers 17 and 18 to count the waiting time for the power supply stabilization. The timers 17, 18 output power supply stabilization waiting completion notifications (notification of counting end of power supply stabilization waiting time) TIME_REQ1, TIME_REQ2 after counting the power supply stabilization waiting time until the power supply voltage output from the DC/DC power supplies 1, 2, which shows that counting the waiting time for power supply stabilization ended according to the power supply control sections 15, 16. The control section 19 outputs the control signals PWR_SEL1, PWR_SEL2, Data_SEL1, and Data_SEL2 and controls the power supply switching sections 7, 8 and the selector sections 9, 10 after waiting for the power supply stabilization waiting completion notifications (notification of counting end of power supply stabilization waiting time) TIME_REQ1, TIME_REQ2 from the timers 17, 18.

Figure 7:
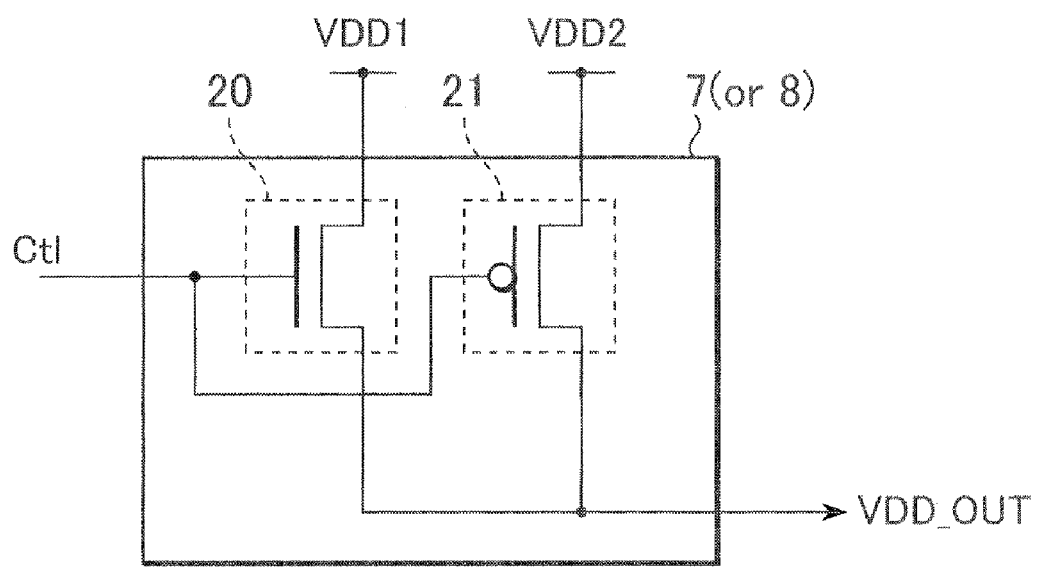
FIG. 7 shows an exemplary configuration of the power supply switching section.

FIG. 7 shows an exemplary configuration of the power supply switching section 7 (or 8). The power supply switching section 7 (or 8) includes an N-channel MOSFET20 and a P-channel MOSFET21. The power supply voltage VDD1 output from one of the DC/DC power supplies 1, 2 is input to MOSFET20. The power supply voltage VDD2 output from the other of the DC/DC power supplies 1, 2 is input to MOSFET21. MOSFET20 outputs the power supply voltage VDD_OUT (VOUT1 or VOUT2) when the control signal Ctl (PWR_SEL1 or PWR_SEL2) from the switching control section 11 is, for example, "1" (high level). On the other hand, MOSFET21 outputs the power supply voltage VDD_OUT (VOUT1 or VOUT2) when the control signal Ctl from the switching control section 11 is "0" (low level).

FIG. 8 shows an exemplary operating state of each section in the semiconductor integrated circuit 3 when the power supply is switched. As shown in FIG. 8, in a state ST1, the DC/DC power supply 1 is connected to the domain 4 and the DC/DC power supply 2 is connected to the domain 5. In this case, the asynchronous bridge section 6 is used to receive and transmit data between the domains 4, 5. In a state ST2, the DC/DC power supply 2 is connected to the domain 4 and the DC/DC power supply 1 is connected to the domain 5. In this case, the asynchronous bridge section 6 is used to receive and transmit data between the domains 4, 5. In a state ST3, the DC/DC power supply 1 is connected to the domain 4, 5. In this case, data is transmitted and received between the domains 4, 5 bypassing the asynchronous bridge section 6. In a state ST4, the DC/DC power supply 2 is connected to the domain 4, 5. In this case, data is transmitted and received between the domains 4, 5 bypassing the asynchronous bridge section 6.

Figure 9:
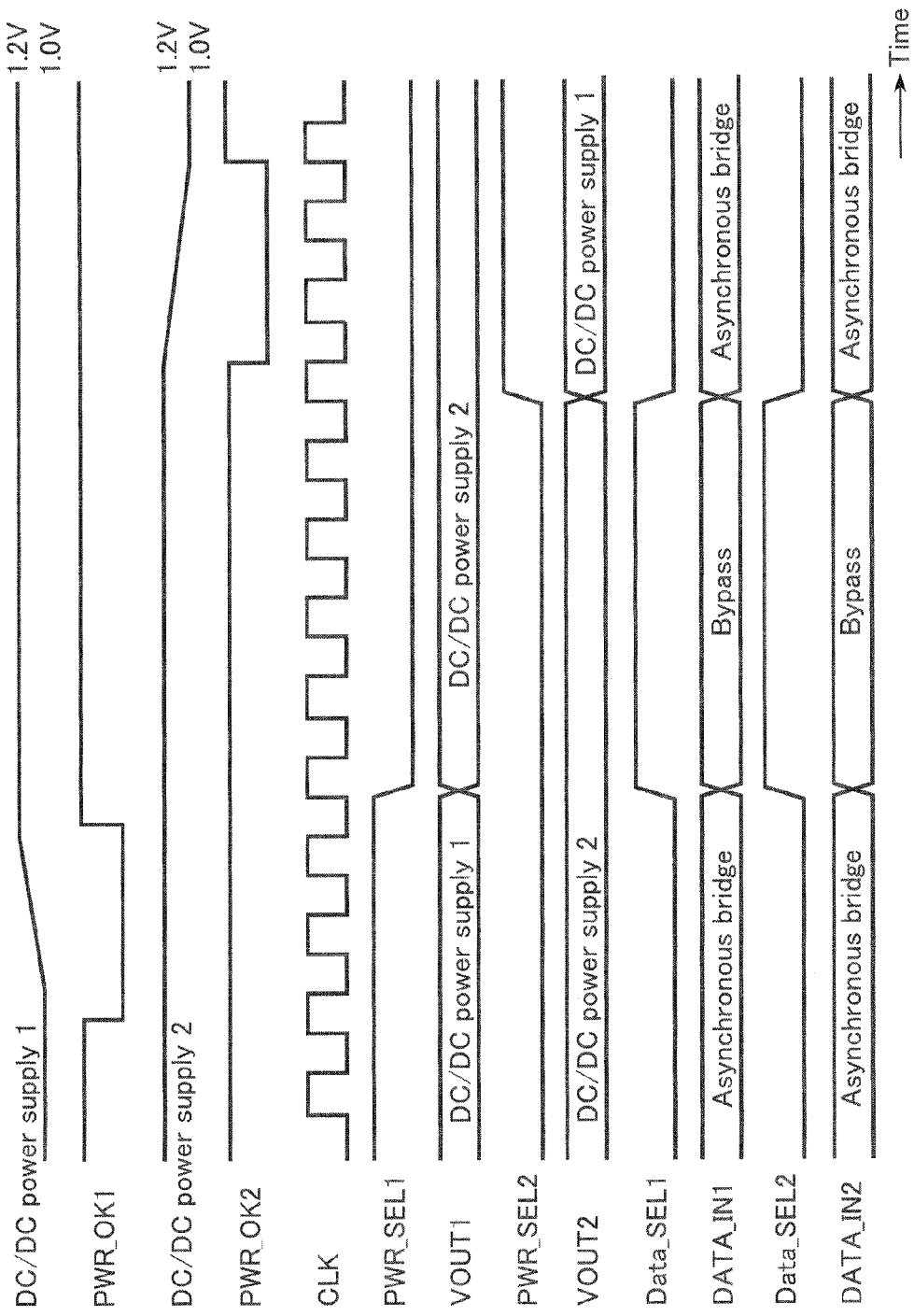
FIG. 9 shows an exemplary timing chart for the operation timing of the first embodiment when the switching control section of FIG. 5 is used.

FIG. 9 shows an exemplary a timing chart for the operation timing of the first embodiment when the switching control section 11 of FIG. 5 is used. In FIG. 9, "asynchronous bridge" means that data is received and transmitted between the domains 4, 5 via the asynchronous bridge section 6, and "bypass" means that data is received and transmitted between the domains 4, 5, bypassing the asynchronous bridge section 6. For example, when the power supply voltage is changed by controlling the DC/DC power supplies 1, 2 from the switching control section 11 so as to make the power supply voltage output from the DC/DC power supply 1 substantially equal to the power supply voltage output from the DC/DC power supply 2, the control signals PWR_SEL1, PWR_SEL2. Data_SEL1, Data_SEL2 are output, a power supply path is switched by the power supply switching sections 7, 8, and a data path is switched by the selector sections 9, 10 after waiting until the power supply adjustment completion notification PWR_OK1 that shows the stabilization state of the DC/DC power supply 1 becomes the high level from the low level. In this case, the voltage adjustment completion notification PWR_OK2 that shows the stabilization state of the DC/DC power supply 2 is originally the high level, and the control signal PWR_SEL2 is originally the low level, even if the voltage adjustment completion notification PWR_OK1 that shows the stabilization state of the DC/DC power supply 1 becomes the high level, the control signal PWR_SEL2 is maintained at the low level.

In addition, when the power supply voltage output from the DC/DC power supply 1 is returned to the voltage that is different from the power supply voltage output from the DC/DC power supply 2, the power supply voltage output from the DC/DC power supply 1 is changed after outputting the control signals PWR_SEL1, PWR_SEL2, Data_SEL1 Data_SEL2, switching the power supply path by the power supply switching sections 7, 8 and switching the data path by the selector sections 9, 10.

Figure 10:
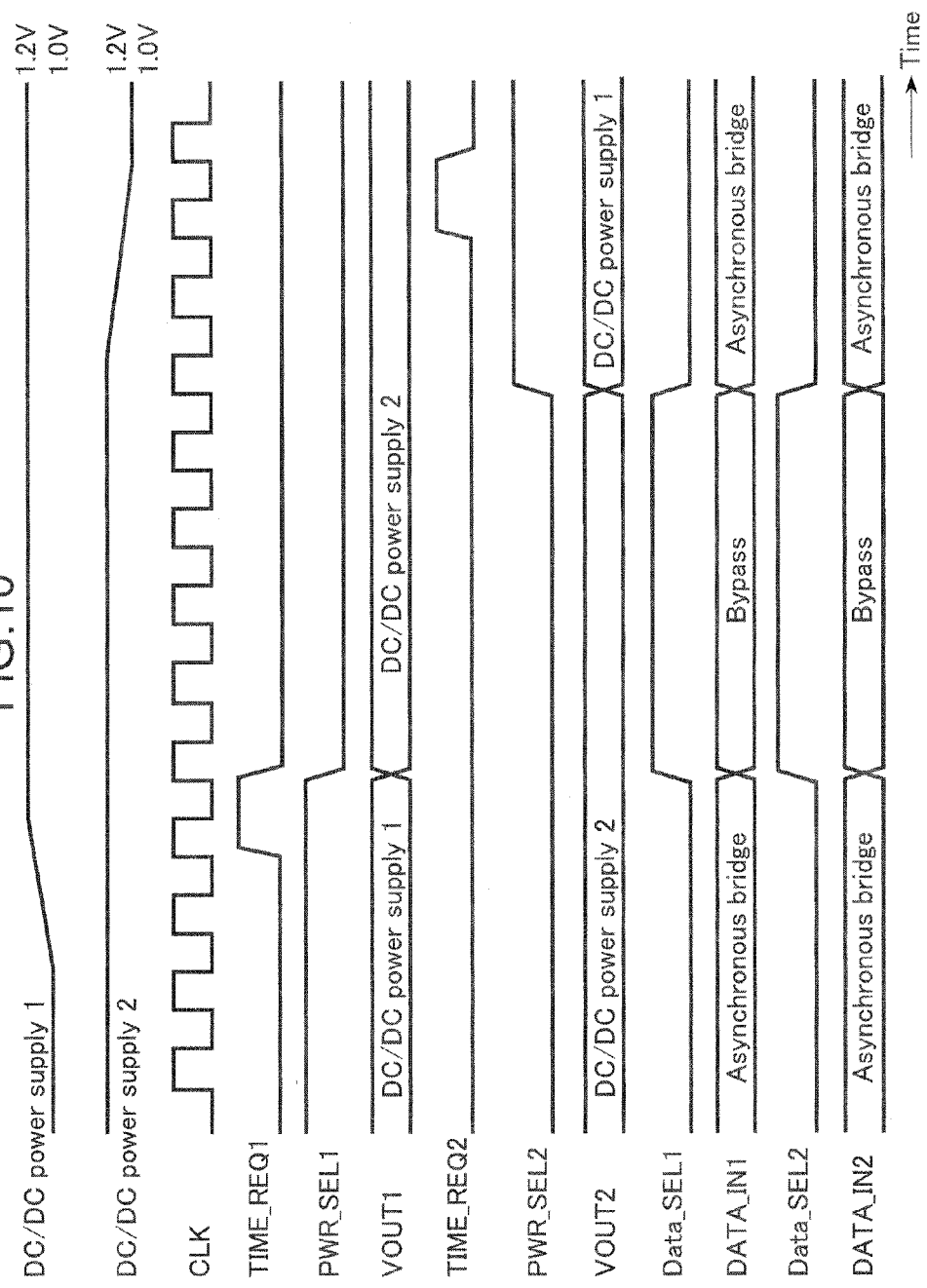
FIG. 10 shows an exemplary timing chart for the operation timing of the first embodiment when the switching control section of FIG. 6 is used.

FIG. 10 shows an exemplary timing chart of operation timing of the first embodiment when the switching control section 11 of FIG. 6 is used. In FIG. 10, "asynchronous bridge" means that data is received and transmitted between the domains 4, 5 via the asynchronous bridge section 6, and "bypass" means that data is received and transmitted between the domains 4, 5, bypassing the asynchronous bridge section 6. For example, when the power supply voltage is changed by controlling the DC/DC power supplies 1, 2 from the switching control section 11 so as to make the power supply voltage output from the DC/DC power supply 1 substantially equal to the power supply voltage output from the DC/DC power supply 2, the control signals PWR_SEL1, PWR_SEL2, Data_SEL1, Data_SEL2 are output, a power supply path is switched by the power supply switching sections 7, 8, and a data path is switched by the selector sections 9, 10 after waiting for the count end notification TIME_REQ1 of the timer 17. In this case, the counting end notification TIME_REQ2 and the control signal PWR_SEL2 of the timer 18 are originally the low level, even if the counting end notification TIME_REQ1 of the timer 17 becomes the high level, the control signal PWR_SEL2 is maintained at the low level.

In addition, when the power supply output from the DC/DC power supply 1 is returned to the voltage that is different from the power supply voltage output from the DC/DC power supply 2, the power supply voltage output from the DC/DC power supply 1 is changed after outputting the control signals PWR_SEL1, PWR_SEL2, Data_SEL1, Data_SEL2, switching the power supply path by the power supply switching sections 7, 8 and switching the data path by the selector sections 9, 10.

Thus, in this embodiment, at first, the power supply switching sections 7, 8 are controlled so that the power supply voltage can be supplied to the domain 4 from the DC/DC power supply 1 and the power supply voltage can be supplied to the domain 5 from the DC/DC power supply 2 by the switching control section 11. In addition, the switching control section 11 controls the selector sections 9, 10 so that output of the asynchronous bridge 6 is connected with each of domains 4, 5. Afterwards, the switching control section 11 sets desired power supply voltage to the DC/DC power supplies 1 and 2. If means to notify the completion of the power supply voltage adjustment at the DC/DC power supplies 1, 2 is provided as shown in FIG. 5, the switching control section 11 switches the power supply path by the power supply switching sections 7, 8 and the data path by the selector sections 9, 10 according to the notification. On the other hand, if means to count the power supply stabilization waiting time of the power supply voltage that the DC/DC power supplies 1, 2 output is provided as shown in FIG. 6, the switching control section 11 switches the power supply path by the power supply switching sections 7, 8 and the data path by the selector sections 9, 10 according to the count.

When the power supply voltages, which the DC/DC power supply sections 1, 2 should output, are the same, the switching control section 11 makes the power supply voltage used by the domains 4, 5 common by switching and controlling the power supply switching section 7 or 8. Further, the switching control section 11 switches and controls the connection of the selector sections 9, 10 so as to bypass the asynchronous bridge section 6.

As explained above, in this embodiment, in the semiconductor integrated circuit including the configuration in which the power supply voltage and the operating frequency are changeable, when the power supply voltages used in plural domains are the same, plural power supply control is performed so that the power supply can be supplied from one power supply, when high-speed data transfer is preformed by increasing the power supply voltage or the power supply voltage and the operating frequency, the asynchronous bridge section is bypassed. As a result, efficient data transfer can be performed between the domains.

Next, another embodiment of the semiconductor integrated circuit that uses 3 or more power supply voltages is explained.

Figure 11:
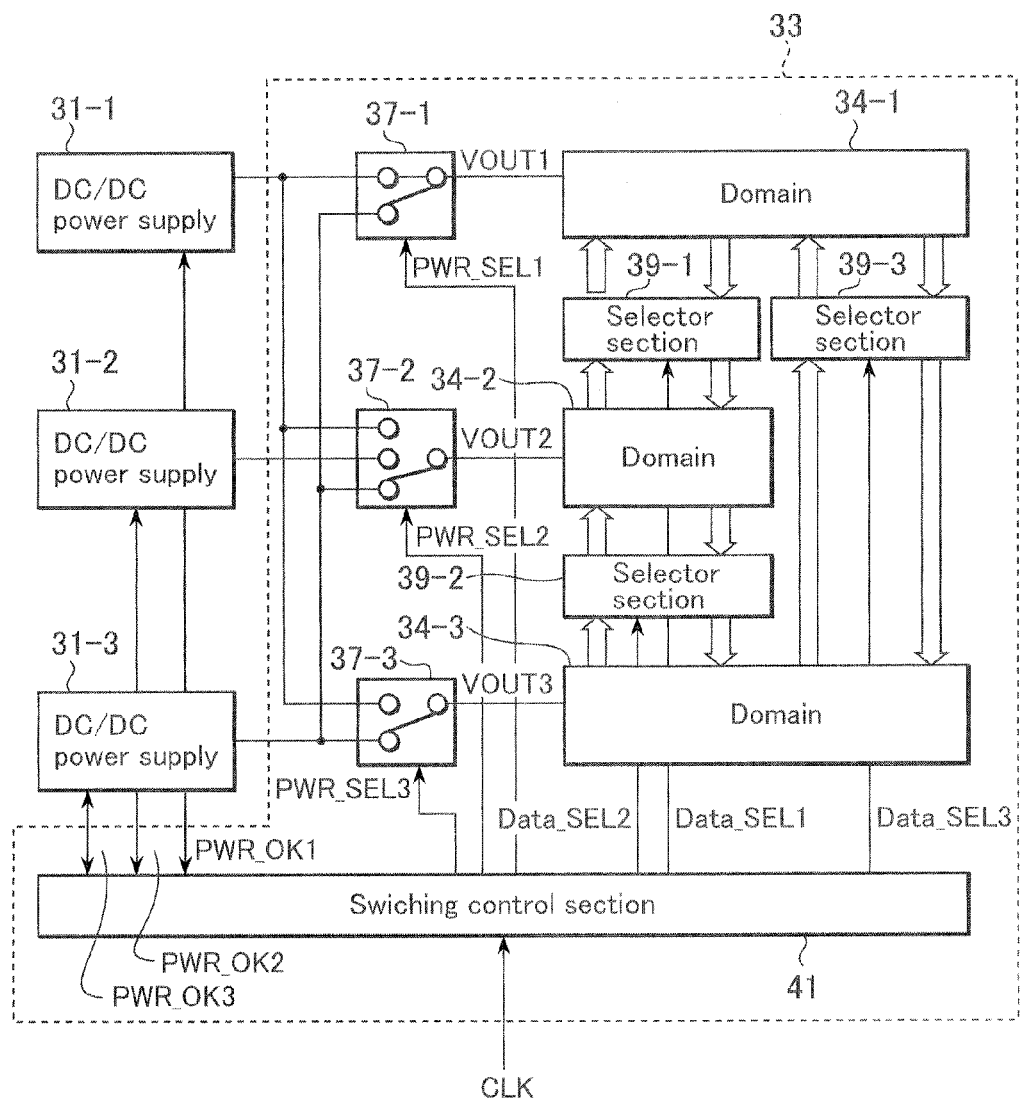
FIG. 11 shows a block diagram of an exemplary semiconductor integrated circuit of the second embodiment.

FIG. 11 shows a block diagram of an exemplary semiconductor integrated circuit of the second embodiment. As shown in FIG. 11, the output power supply voltage of DC/DC power supplies 31-1, 31-2, and 31-3 can be controlled, and the DC/DC power supplies 31-1, 31-2, and 31-3 can supply the power supply voltage to the semiconductor integrated circuit 33, which can be a LSI circuit, for example. The semiconductor integrated circuit 33 includes domains 34-1, 34-2, 34-3, asynchronous section (not shown), power supply switches sections 37-1, 37-2, 37-3, selectors 39-1, 39-2, 39-3, and switching control section 41. In FIG. 11, though showing the asynchronous bridge is omitted so as not to obstruct the block diagram, as understood from FIG. 4, the asynchronous bridge section has been actually provided between domains 34-1, 34-2, between the domains 34-2, 34-3, and between the domains 34-1, 34-3. The domain 34-1 is a circuit section where the power supply voltage from the DC/DC power supply 31-1 or DC/DC power supply 31-3 is used. The domain 34-2 is a circuit section where the power supply voltage from the DC/DC power supply 31-1 or DC/DC power supply 31-2 or DC/DC power supply 31-3 is used. The domain 34-3 is a circuit section where the power supply voltage from DC/DC power supply 31-3 or DC/DC power supply 31-1 is used. The switching control section 41 controls the power supply voltage output from the DC/DC power supplies 31-1, 31-2, 31-3 as well as the power supply switching sections 37-1, 37-2, 37-3 and selector sections 39-1, 39-2, 39-3. The power supply switching sections 37-1, 37-2, 37-3 are controlled so that they output one of the power supply voltages output from the DC/DC power supplies 31-1, 31-2, 31-3, one of the power supply voltages output from the DC/DC power supplies 31-1, 31-2, 32-3, and the other of the power supply voltages output from the DC/DC power supplies 31-1, 31-2, 31-3 by the control signals PWR_SEL1, PWR_SEL2, PWR_SEL3 from the switching control section 41 as the power supply voltages VOUT1, VOUT2, VOUT3. The selector sections 39-1, 39-2, 39-3 are controlled so as to connect between the domains 34-1, 34-2, between the domains 34-2, 34-3, and between the domains 34-1, 34-3 via the asynchronous bridge or bypass the asynchronous bridge. Data DADA_IN1 is input from the selector section 39-1 or 39-3 into the domain 34-1. Data DATA_IN2 is input from the selector sections 39-1, 39-2 into the domain 34-2. Data DATA_IN3 is input from the selector sections 39-2, 39-3 into the domain 34-3. When the signal is received and transmitted between the two domains that use different power supply voltages, the signal is received and transmitted via the asynchronous bridge where the signal level is converted and synchronized.

The DC/DC power supplies 31-1 to 31-3 may have the same configuration; the power supply switching sections 37-1 to 37-3 may have the same configuration; and the selector sections 39-1 to 39-3 may have the same configuration.

Further, when the domain 34-1 always uses only the power supply voltage from the DC/DC power supply 31-1, the domain 34-2 always uses only the power supply voltage from the DC/DC power supply 31-2, and the domain 34-3 always uses only the power supply voltage from the DC/DC power supply 31-3, the power supply switch sections 37-1 to 37-3 can be omitted. Further, the switching control section 41 can be provided outside of the semiconductor integrated circuit 33.

The configuration of the switching control section 41 can be made by changing the configuration shown in FIG. 5 according to the case when the three DC/DC power supplies are provided. Thus, such a configuration and its explanation are omitted. That is, the switching control section 41 is provided with not only the configuration in FIG. 5 but the third power supply control section in the third DC/DC power supply to output the control signal, and the control section 14 in FIG. 5 outputs the control signals PWR_SEL2, Data_SEL2 after waiting for the completion notification PWR_OK2 of the power supply adjustment from the third DC/DC power supply 31-2 and controls the power supply switching section 37-2 and the selector section 34-2. In addition, the switching control section 41 may be changed according to the case of the configuration in FIG. 6 in which three DC/DC power supplies are provided.

The configuration of power supply switching sections 37-1, 37-2, 37-3 can be similar to the configuration shown in FIG. 7.

Figure 12:
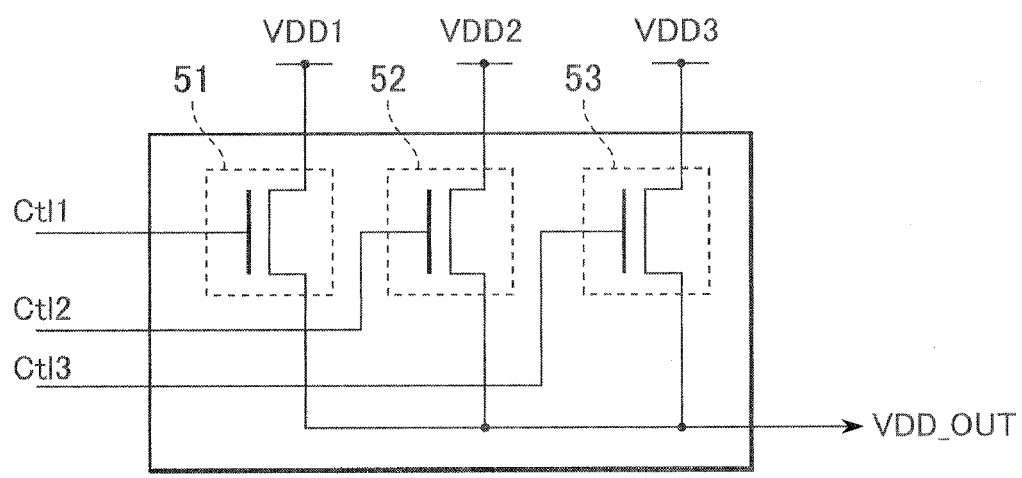
FIG. 12 shows an exemplary configuration of the power supply switching section.

FIG. 12 shows an exemplary configuration of the power supply switching section 37-2. The power supply switching section 37-2 comprises N-channel MOSFETs 51, 52, 53 connected as shown in FIG. 12. For example, the power supply voltages VDD1, VDD2, VDD3 output from the respective DC/DC power supplies 31-1, 31-2, 31-3 are input to the respective MOSFETs 51, 52, 53. MOSFETs 51, 52, 53 output the power supply voltage VOUT1 by the power supply voltage VDD_OUT output when the control signals Ctl1, Ctl2, Ctl3 (PWR_SEL2) from the switching control section 41 show for example "2 h." MOSFETs 51, 52, 53 output the power supply voltage VOUT2 by the power supply voltage VDD_OUT output when the control signals Ctl1, Ctl2, Ctl3 (PWR_SEL2) from the switching control section 41 show for example "4 h." MOSFETs 51, 52, 53 output the power supply voltage VOUT3 by the power supply voltage VDD_OUT output when the control signals Ctl1, Ctl2, Ctl3 (PWR_SEL2) from the switching control section 41 show for example "1 h."

Figure 13:
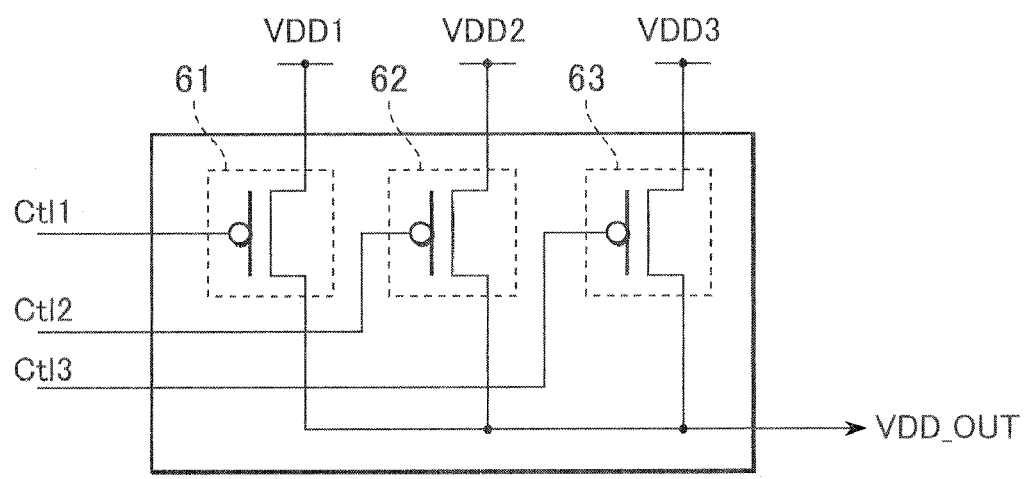
FIG. 13 shows another exemplary configuration of the power supply switching section.

FIG. 13 shows an exemplary configuration of the power supply switching section 37-2. The power supply switching section 37-2 comprises P-channel MOSFETs 61, 62, 63 connected as shown in FIG. 13. For example, the power supply voltages VDD1, VDD2, VDD3 output from the respective DC/DC power supplies 31-1, 31-2, 31-3 are input to the respective MOSFETs 61, 62, 63. MOSFETs 61, 62, 63 output the power supply voltages VOUT1, VOUT2, or VOUT3 by the power supply voltages VDD_OUT according to the control signals Ctl1, Ctl2, Ctl3 (PWR_SEL2) from the switching control section 41.

FIG. 14 shows an exemplary operating state of each section in the semiconductor integrated circuit 33 when the power supply is switched. In this embodiment, as shown in FIG. 8, there are states St1 to St12. In St1 and St2, all the power supply voltages are different between the domains 34-1 to 34-3. In St3 to St10, some of the power supply voltages are the same or only partially different between the domains 34-1 to 34-3. In St11 and St12, all the power supply voltages are the same between domains 34-1 to 34-3. For example, in the state St1, the DC/DC power supplies 31-1, 31-2, 31-3 are connected with the domains 34-1 to 34-3, and the asynchronous bridge is used in this case. In the state St3, the DC/DC power supply 31-1 is connected with the domains 34-1, 34-2, the DC/DC power supply 31-3 is connected with the domain 31-3. In this case, data is received and transmitted between the domains 34-1 and 34-2 by bypassing the asynchronous bridge section, and data is received and transmitted between the domains 34-2, 34-3 and domains 34-3, 34-1 via the asynchronous bridge section. In the state St11, the DC-DC power supply 31-1 is connected with all the domains between 34-1 to 34-3. In this case, all the data reception and transmission between the domains 34-1 and 34-2, between the domains 34-2 and 34-3 and between the domains 34-3 and 34-1 are performed by bypassing the asynchronous bridge section.

Figure 15:
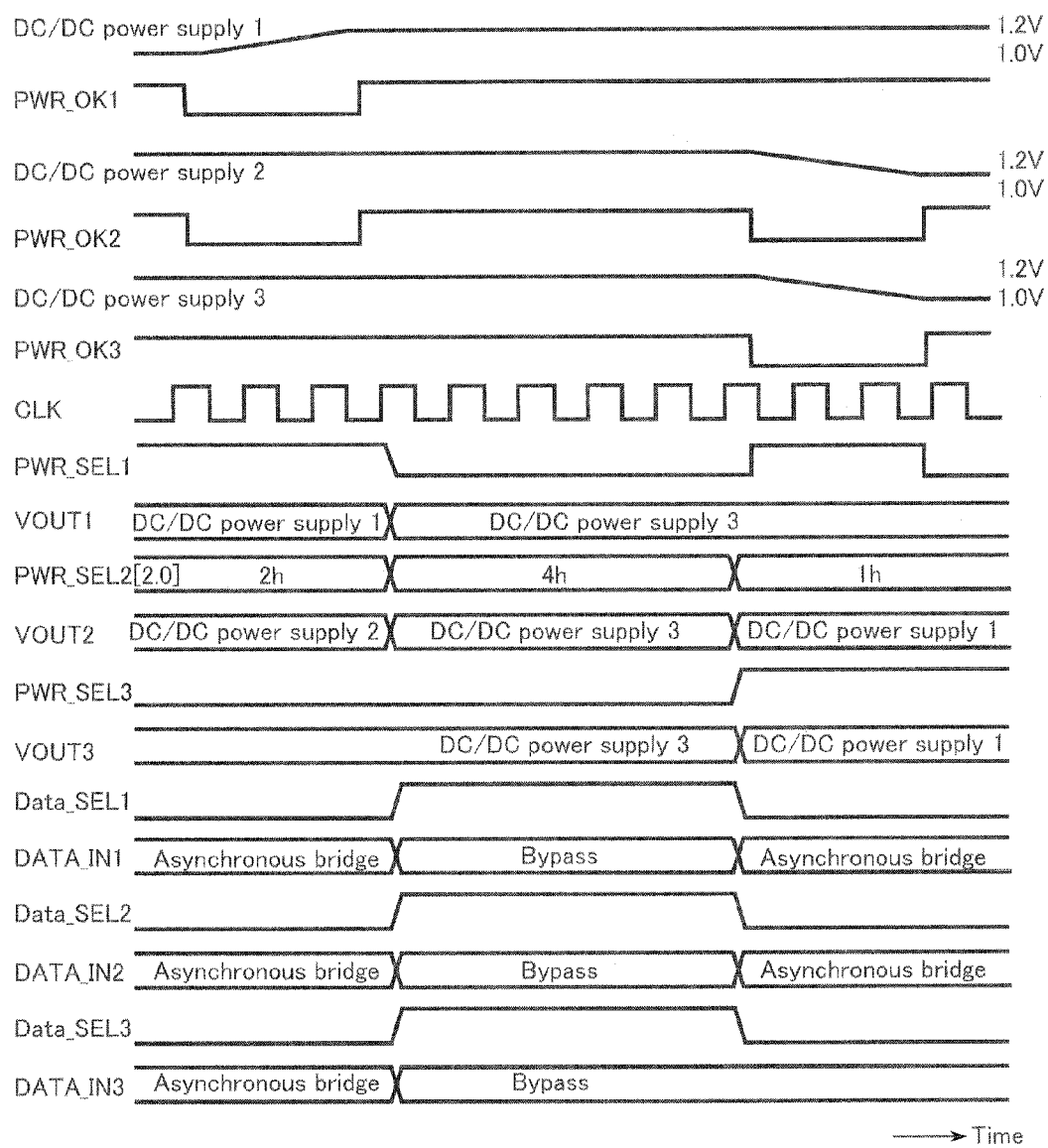
FIG. 15 shows an exemplary timing chart for the operation timing of the second embodiment.

FIG. 15 shows an exemplary timing chart for the operation timing of the second embodiment. For example, when the power supply voltage is changed by controlling the DC/DC power supplies 31-1 to 31-3 from the switching control section 41 so as to make the power supply voltage output from the DC/DC power supply 31-1, 31-2 become the same as the power supply voltage output from the DC/DC power supply 31-3, the control signals PWR_SEL1 to PWR_SEL3, Data_SEL1 to Data_SEL3 are output, a power supply path is switched by the power supply switching sections 37-1 to 37-3, and a data path is switched by the selector sections 39-1 to 39-3 after waiting until the voltage adjustment completion notification PWR_OK1, PWR_OK2 transitioned from the low level to the high level that shows the stabilization state of the DC/DC power supply 31-1, 31-2 becomes the high level from the low level. In this case, because the voltage adjustment completion notification PWR_OK3 that shows the stabilization state of the DC/DC power supply 31-3 is originally the high level, and the control signal PWR_SEL3 is originally the low level, even if the voltage adjustment completion notification PWR_OK1, PWR_OK2 that show the stabilization state of the DC/DC power supply 31-1, 31-2 become the high level, the control signal PWR_SEL2 is maintained at the low level.

In addition, when the power supply voltage output from the DC/DC power supply 31-1, 31-2 is returned to the voltage that is different from the power supply voltage output from the DC/DC power supply 31-3, the power supply voltage output from the DC/DC power supply 31-1, 31-2 is changed after outputting the control signals PWR_SEL1 to PWR_SEL3, Data_SEL1 to Data_SEL3, switching the power supply path by the power supply switching sections 37-1 to 37-3, and switching the data path by the selector sections 39-1 to 39-3.

As explained in the above, in this embodiment, in the semiconductor integrated circuit including the configuration in which the power supply voltage and the operating frequency are changeable, when the power supply voltages used in plural domains are the same, plural power supply control is performed so that the power supply can be supplied from one power supply, when high-speed data transfer is performed by increasing the power supply voltage or the power supply voltage and the operating frequency, the asynchronous bridge section is bypassed. As a result, efficient data transfer can be performed between the domains.

As a result, according to an embodiment of the present invention, the plural power supply control method for the semiconductor integrated circuit, including the plural domains using the power supply voltage from the plural power supplies, the asynchronous bridge section being provided between domains and receiving and transmitting data, and the configuration that can dynamically change the power supply voltage used by at least each domain according to the load, if the power supply voltages used by at least the two domains are the same, includes a power supply path switching step that switches the power supply paths so as to supply the power supply voltage from one power supply, and a data path switching step that switches the data paths so as to receive and transmit data between the two domains by bypassing the asynchronous bridge section. If the method includes a change step that changes the power supply voltage output from at least one power supply to the target voltage, the power supply path switching step and the data path switching step are performed after the change step ends. The power supply path switching step is executed by the switching control section (11, 41) and the power supply switching section (7, 8, 37-1 to 37-3). The data path switching step is executed by the switching control sections (11, 41) and selector sections (9, 10, 39-1 to 39-3). The change step is executed by the switching control sections (11, 14).

In addition, according to an embodiment of the present invention, the semiconductor integrated circuit including the plural domains using the power supply voltage from the plural power supplies, the asynchronous bridge section being provided between the domains and receiving and transmitting data between the domains, and the configuration that can dynamically change the power supply voltage used by each domain according to at least the load, includes the power supply switching means that controls the power supply path to connect the plural power supplies with the plural domains, the data path switching means that controls the data path to receive and transmit the data between the two domains, and the switching control means that controls the power supply switching means and the data path switching means, if the power supply voltages used by the two domains are the same, the switching control means supplies the power supply voltage from one power supply by controlling the power supply switching means and switching the power supply path to the two domains, and receives and transmits the data between the two domains by bypassing the asynchronous bridge section by controlling the data path switching means and the data path. If the semiconductor integrated circuit according to an embodiment of the present invention further includes change means to change the power supply voltage output from at least the one power supply to the target voltage, the switching control means switches the power supply path by controlling the power supply switching means after the power supply voltage was changed by the change means, and switches the data path by controlling the data path switching means. The power supply path switching means can be realized by the switching control section (11, 41). The data path switching means can be realized by the selector sections (9, 10, 39-1 to 39-3). The switching control means can be realized by the switching control section (11, 41). The switching change means can be realized by the switching control section (11, 14).

In each of the above embodiments, the case when the power supply is the DC/DC power supply was explained, though the power supply is not limited if the power supply to output can be dynamically changed. Embodiments of the present invention are effective especially when using the power supply having the configuration in which the power supply voltage changes according to the load change.

For purposes of explanation, in the above description, numerous specific details are set forth in order to provide a thorough understanding of the invention. It will be apparent, however, to one skilled in the art that the invention can be practiced without these specific details. In other instances, well-known structures and devices are shown in block diagram form in order to avoid obscuring the invention.

While the invention has been described in conjunction with the specific embodiments thereof, it is evident that many alternatives, modifications, and variations will be apparent to those skilled in the art. Accordingly, embodiments of the invention, as set forth herein, are intended to be illustrative, not limiting. There are changes that may be made without departing from the spirit and scope of the invention.

What is claimed is:

1. A method for controlling a semiconductor integrated circuit having a plurality of domains, the method comprising:
   controlling a plurality of power supplies which supply power to the plural of domains;
   controlling an asynchronous bridge section being provided between each of the domains;
   receiving and transmitting data for dynamically changing a power supply voltage of at least one of the domains, wherein
   when a power supply voltage of one of the domains is substantially equal to a power supply voltage of the other domains,
      switching power supply paths so as to supply the power supply voltage from one power supply to at least two of the domains, and
      switching data paths so as to receive and transmit data between the at least two domains by bypassing the asynchronous bridge section.

2. The method according to claim 1, further comprising:
   adjusting the power supply voltage output from at least one power supply to a target voltage, wherein the switching of the power supply paths and the switching of the data paths are performed after the adjusting is complete.

3. The method according to claim 2, wherein the adjusting further comprises:
   providing notification of a completion of the adjusting of the power supply voltage output from at least one power supply to the target voltage from at least one power supply, wherein the switching of the power supply paths and the switching of the data paths are performed after the providing.

4. The method according to claim 2 wherein the adjusting further comprises:
   measuring a power supply stabilization time, which is a time for a power supplied by at least one power supply to stabilize, and providing notification of a completion of the measuring, wherein the switching of the power supply paths and the switching of the data paths are performed after the providing.

5. The method according to claim 1, wherein
the switching of the power supply paths and the switching of the data paths are performed when the power supply voltages used by the at least two domains are made substantially equal and high-speed data transfer is performed between the at least two domains.

6. The method according to claim 1, wherein
the switching of the power supply paths and the switching of the data paths are performed when the power supply voltages and operation frequencies used by the at least two domains are increased and high-speed data transfer is performed between the at least two domains.

7. The method according to claim 1, wherein
the power supply voltages from the plurality of power supplies are the power supply voltages from a plurality of DC/DC power supplies.

8. A semiconductor integrated circuit comprising:
a plurality of domains that supply power supply voltage from a plurality of power supplies;
an asynchronous bridge section, provided between the domains, that receives and transmits data between the domains;
a power supply switching section that controls a power supply path to connect the plurality of power supplies with the plurality of domains;
a data path switching section that controls a data path to receive and transmit data between at least two of the domains; and
a switching control section that controls the power supply switching section and the data path switching section, wherein
when a power supply voltage of at least one of the domains is substantially equal to a power supply voltage of the other domains, the switching control section supplies the power supply voltage from one power supply to at least two of the domains by controlling the power supply switching section and switching the power supply path, and receives and transmits the data between the at least two domains by bypassing the asynchronous bridge section by controlling the data path switching section.

9. The semiconductor integrated circuit according to claim 8, further comprising:
a voltage adjusting section that adjusts the power supply voltage output from at least one of the power supplies to a target voltage, wherein
the switching control section switches the power supply paths by controlling the power supply switching section after the voltage adjustment by the voltage adjusting section ends, and switches the data paths by controlling the data path switching section.

10. The semiconductor integrated circuit according to claim 9, wherein
the at least one power supply performs a completion notification of the voltage adjustment to indicate that the adjustment of the power supply voltage output is complete, and the switching control section controls the power supply path switching section and the data path switching section after waiting for the completion notification of the voltage adjustment.

11. The semiconductor integrated circuit according to claim 9, wherein
the voltage adjusting section counts a power supply stabilization waiting time until the power supply voltage output from the at least one power supply stabilizes, and performs completion notification to indicate that the count of the power supply stabilization waiting time ends, and the switching control section controls the power supply path switching section and the data path switching section after waiting for the completion notification of the power supply stabilization waiting.

12. The semiconductor integrated circuit according to claim 8, wherein
the switching control section controls the power supply path switching section and the data path switching section when the power supply voltages used by the at least two domains have substantially equal electric potentials and high-speed data transfer is performed between the at least two domains.

13. The semiconductor integrated circuit according to claim 8, wherein
the switching control section controls the power supply path switching section and the data path switching section when high-speed data transfer is performed between the domains by increasing the power supply voltage and operating frequencies used by the at least two domains.

14. The semiconductor integrated circuit according to claim 8, further comprising:
a first selector section in which the data path switching section inputs an output from a first domain out of the at least two domains directly or via the asynchronous bridge section to a second domain, and
a second selector section in which an output from the second domain is input directly or via the asynchronous bridge section to the first domain.

15. The semiconductor integrated circuit according to claim 8, wherein
the power supply voltages are supplied by a plurality of DC/DC power supplies.

* * * * *